US009588208B2

(12) United States Patent
Polimeni et al.

(10) Patent No.: US 9,588,208 B2
(45) Date of Patent: Mar. 7, 2017

(54) METHODS, SYSTEMS AND APPARATUSES FOR RAPID SEGMENTED, ACCELERATED, AND SIMULTANEOUS MULTI-SLICE ECHO PLANAR IMAGING

(71) Applicants: Massachusetts General Hospital, Boston, MA (US); Siemens Medical Solutions USA, Inc., Malvern, PA (US)

(72) Inventors: Jonathan Rizzo Polimeni, Cambridge, MA (US); Himanshu Bhat, Cambridge, MA (US); Keith Aaron Heberlein, Charlestown, MA (US); Kawin Setsompop, Charlestown, MA (US); Thomas Witzel, Boston, MA (US); Stephen Farman Cauley, Cambridge, MA (US)

(73) Assignees: National Institutes of Health (NIH), U.S. Dept. of Health and Human Services (DHHS), U.S. Government NIH Division of Extramural Inventions and Technology Resources (DEITR), Washington, DC (US); Siemens Healthcare GmbH, Erlangen (DE)

(*) Notice: Subject to any disclaimer, the term of this patent is extended or adjusted under 35 U.S.C. 154(b) by 499 days.

(21) Appl. No.: 14/271,754

(22) Filed: May 7, 2014

(65) Prior Publication Data
US 2015/0323634 A1   Nov. 12, 2015

(51) Int. Cl.
G01V 3/00       (2006.01)
G01R 33/561    (2006.01)
G01R 33/56     (2006.01)
G01R 33/34     (2006.01)
G01R 33/565    (2006.01)
(Continued)

(52) U.S. Cl.
CPC .... *G01R 33/5611* (2013.01); *G01R 33/34092* (2013.01); *G01R 33/5608* (2013.01); *G01R 33/5616* (2013.01); *G01R 33/56509* (2013.01); *G01R 33/482* (2013.01); *G01R 33/4835* (2013.01); *G01R 33/546* (2013.01)

(58) Field of Classification Search
CPC .......... G01R 33/5611; G01R 33/34092; G01R 33/56509; G01R 33/482; G01R 33/4835; G01R 33/546; G01R 33/5608
USPC ....................................................... 324/309
See application file for complete search history.

(56) References Cited

U.S. PATENT DOCUMENTS 8,604,786 B2 * 12/2013 Stemmer ................ A61B 5/055
                                                       324/307
2014/0225612 A1 * 8/2014 Polimeni ................ G01R 33/48
                                                       324/309

OTHER PUBLICATIONS

Feinberg et al., Ultra-Fast MRI of the Human Brain with Simultaneous Multi-Slice Imaging, Apr. 2013, J Magn Reson, 229: 90-100.*

(Continued)

*Primary Examiner* — Susan Lee

(57) ABSTRACT

A method for accelerated segmented magnetic resonance (MR) image data acquisition includes using a plurality of RF pulses to excite one or more slices of an anatomical area of interest according to a predetermined slice acceleration factor. Next, a collapsed image comprising the slices is acquired using a consecutive segment acquisition process. Then, a parallel image reconstruction method is applied to the collapsed image to separate the collapsed image into a plurality of slice images.

22 Claims, 7 Drawing Sheets

(51) Int. Cl.
G01R 33/48 (2006.01)
G01R 33/483 (2006.01)
G01R 33/54 (2006.01)

(56) References Cited

OTHER PUBLICATIONS

Setsompop et al., Improving Diffusion MRI using Simultaneous Multi-Slice Echo Planar Imaging, Oct. 2012, Neuroimage, 63(1): 569-580.*

* cited by examiner

METHODS, SYSTEMS AND APPARATUSES FOR RAPID SEGMENTED, ACCELERATED, AND SIMULTANEOUS MULTI-SLICE ECHO PLANAR IMAGING

This invention was made with government support under Grant Number K01-EB011498 awarded by the National Institutes of Health. The government has certain rights in the invention.

TECHNICAL FIELD

The present invention relates generally to methods, systems, and apparatuses for integrating a method for segmenting multiple-slice Echo Planar Imaging (EPI) data with parallel imaging acceleration with a simultaneous multi-slice technique for image acquisition. The disclosed methods, systems, and apparatuses may be applied to, for example, improvement of image quality in functional and structural Magnetic Resonance Imaging (MRI) applications.

BACKGROUND

Magnetic Resonance Imaging (MRI) is a non-invasive medical imaging technique that utilizes magnetization to visualize soft tissue. Echo Planar Imaging (EPI) is a widely used method for rapidly acquiring MRI images. EPI may be used, for example, for measuring dynamic activity in the brain with functional MRI and for increasing the time efficiency in diffusion-weighted or perfusion-weighted MRI. Ideally, each EPI slice is acquired in a single shot to minimize its vulnerability to tissue or organ motion. However, in some cases, single-shot acquisitions are infeasible because of the long encoding trains required. As the image encoding time (i.e., the full image readout time) becomes longer, the resulting images suffer from $T_2^*$ related blurring effects and $B_0$ inhomogeneity related geometric distortion.

Accelerated parallel imaging techniques can be applied to EPI acquisitions to reduce the number of phase encoding steps and therefore reduce the total readout time. In turn, this time reduction decreases the image blur and geometric distortion artifacts caused by off-resonance effects. However, by reducing the number of phase encoding steps, accelerated techniques suffer from an inherent loss in signal-to-noise ratio (SNR) since less data is collected during the image acquisition. This missing data may be estimated using parallel imaging reconstruction techniques, but this introduces an additional loss that is dependent on the geometry and layout of the receive coil array used to detect the MR signal. The additional loss is captured quantitatively as the so-called geometry factor or "g-factor" map. This g-factor increases exponentially with the degree of acceleration. Furthermore, for a given receive coil array, there is a limit on how much an acquisition can be accelerated before the parallel imaging reconstruction is unable to remove the image undersampling artifacts introduced by the acceleration. Therefore, both the increased SNR losses and the increased image artifact levels that arise from higher acceleration factors place an upper bound on how much acceleration can be used to counter the image blur and geometric distortion seen in single-shot EPI images.

Another approach to reduce the total readout time and echo spacing is to partition each image into multiple subsets or segments and acquire each segment separately, each in a shorter time period. After acquisition, the multiple segments are assembled into a fully-sampled image. This approach reduces the readout time per segment and thus reduces the blurring effects and geometric distortion. This segmented, multi-shot approach does not suffer from the same inherent SNR loss seen in accelerated imaging because the full image is acquired, albeit in multiple steps. In conventional segmented, multi-shot imaging with multiple image slices, the first segment is acquired for each slice initially, then the second segment for each slice, and so on. This sampling strategy allows for magnetization recovery for any given image slice during the time period during which the other slices are acquired, which provides a high signal level for each image. However, this segmented multiple-slice acquisition strategy (henceforth referred to as "consecutive-slice" imaging) makes the segmented images vulnerable to artifacts caused by patient movement or by physiological changes in the tissue (e.g., caused by dynamic respiratory- or cardiac-induced effects) occurring in the interval that elapses between the acquisition of each segment in a single image. Any changes that occur between the segments result in a misalignment of the data acquired across the segments and cause severe image artifacts in the assembled image. Furthermore, while each individual segment is acquired in a short time window in order to reduce blurring effects and geometric distortion, the total time to acquire a full image is increased as the number of segments increases, leading to a loss of temporal efficiency which can prolong scan times. Thus, the prolonged scan time places an upper bound on how much segmentation can be used to counter the image blur and geometric distortion seen in un-accelerated EPI images.

Accordingly, it is desired to provide segmented acquisition strategy that is less vulnerable than the aforementioned consecutive-slice imaging to image blur, geometric distortion, and other artifacts caused by patient movement or by physiological changes in the tissue.

SUMMARY

Embodiments of the present invention address and overcome one or more of the above shortcomings and drawbacks, by providing methods, systems, and apparatuses that integrate a robust method for segmenting multiple-slice EPI data with parallel imaging acceleration and the Simultaneous Multi-Slice technique for the image acquisition. This technology is particularly well-suited for, but by no means limited to, improving image quality in structural and functional imaging applications.

According to some embodiments of the present invention, a method for accelerated segmented magnetic resonance (MR) image data acquisition includes using Radio Frequency (RF) pulses to excite one or more slices of an anatomical area of interest according to a predetermined slice acceleration factor. In some embodiments, this slice acceleration factor is greater than 1 and each of the RF pulses is a multiband RF pulse operable to simultaneously excite the slices. Next, a collapsed image comprising the slices is acquired using a consecutive segment acquisition process. Then, a parallel image reconstruction method (e.g., Slice GRAPPA) is applied to the collapsed image to separate the collapsed image into slice images. In one embodiment, the method further includes applying encoding technique (e.g., Blipped-Controlled Aliasing in Parallel Imaging technique) to control an aliasing pattern of the collapsed image. In one embodiment, the consecutive segment acquisition process is integrated with an in-plane accelerated acquisition process applied to the anatomical area of interest.

In some embodiments of the aforementioned method, the consecutive segment acquisition process applies a varying flip angle sequence across consecutive segments of k-space line data representative of a respective slice. In one embodiment, the varying flip angle sequence is a progression of flip angles that maximizes magnetization of a region of the anatomical area of interest corresponding to the respective slice. In another embodiment, the varying flip angle sequence comprises a predetermined low flip angle repeated for each segment included in the respective slice. One or more dummy pulses may be applied prior to acquiring each of the slices.

In some embodiments of the aforementioned method, a reference scan of the anatomical area of interest is performed to acquire reference slices using the consecutive segment acquisition process. The reference slices are then used to calibrate the parallel image reconstruction method such that echo-spacing of the reference slices is matched to accelerated image data corresponding to the collapsed image. In one embodiment, additional reference scans of the anatomical area of interest are performed to acquire additional reference slices using the consecutive segment acquisition process. Then, the reference slices and the additional reference scans are averaged together to yield averaged reference slices. In these embodiments, the parallel image reconstruction method may be calibrated using the averaged reference slices. In other embodiments, following the reference scan, an additional reference scan is performed to acquire one segment of the anatomical area of interest using a high flip angle pulse (e.g., 90°). Then, the acquired segment is used to calibrate an in-plane Slice GRAPPA kernel used in the parallel image reconstruction method.

According to other embodiments of the present invention, a method for accelerated segmented MR image data acquisition includes applying RF pulses to excite slices of an anatomical area of interest according to a predetermined slice acceleration factor. In one embodiment, the slice acceleration factor is greater than 1 and each of multiband RF pulses are used to simultaneously excite the slices. Then, a slice acquisition process is applied to acquire a collapsed image of the slices. In one embodiment, this slice acquisition process includes acquiring consecutive segments of k-space line data included in the respective slice using a varying flip angle sequence applied across the segments. Then, a parallel image reconstruction method (e.g., Slice GRAPPA) is applied to the collapsed image to separate the collapsed image into slice images. In some embodiments, an encoding technique may be applied to control an aliasing pattern of the collapsed image.

According to another aspect of the present invention, a system for performing accelerated segmented MR image data acquisition includes an RF generator and an image data processor. The RF generator is configured to use RF coils to simultaneously excite slices of an anatomical area of interest with multi-band RF pulses and, in response, acquire a collapsed image comprising a plurality of slices using a consecutive segment acquisition process. The image data processor is configured to apply a parallel image reconstruction method to the collapsed image to separate the collapsed image into slice images.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures.

DETAILED DESCRIPTION

The present invention relates generally to methods, systems, and apparatuses for integrating a robust method for segmenting multiple-slice Echo Planar Imaging (EPI) data with parallel imaging acceleration and a simultaneous multi-slice technique for the image acquisition. In some embodiments, these techniques are combined with a related robust method for acquiring the reference scan data used both for in-plane parallel imaging acceleration and the Blipped-Controlled Aliasing in Parallel Imaging (blipped-CAIPI) based simultaneous multi-slice method.

Figure 1:
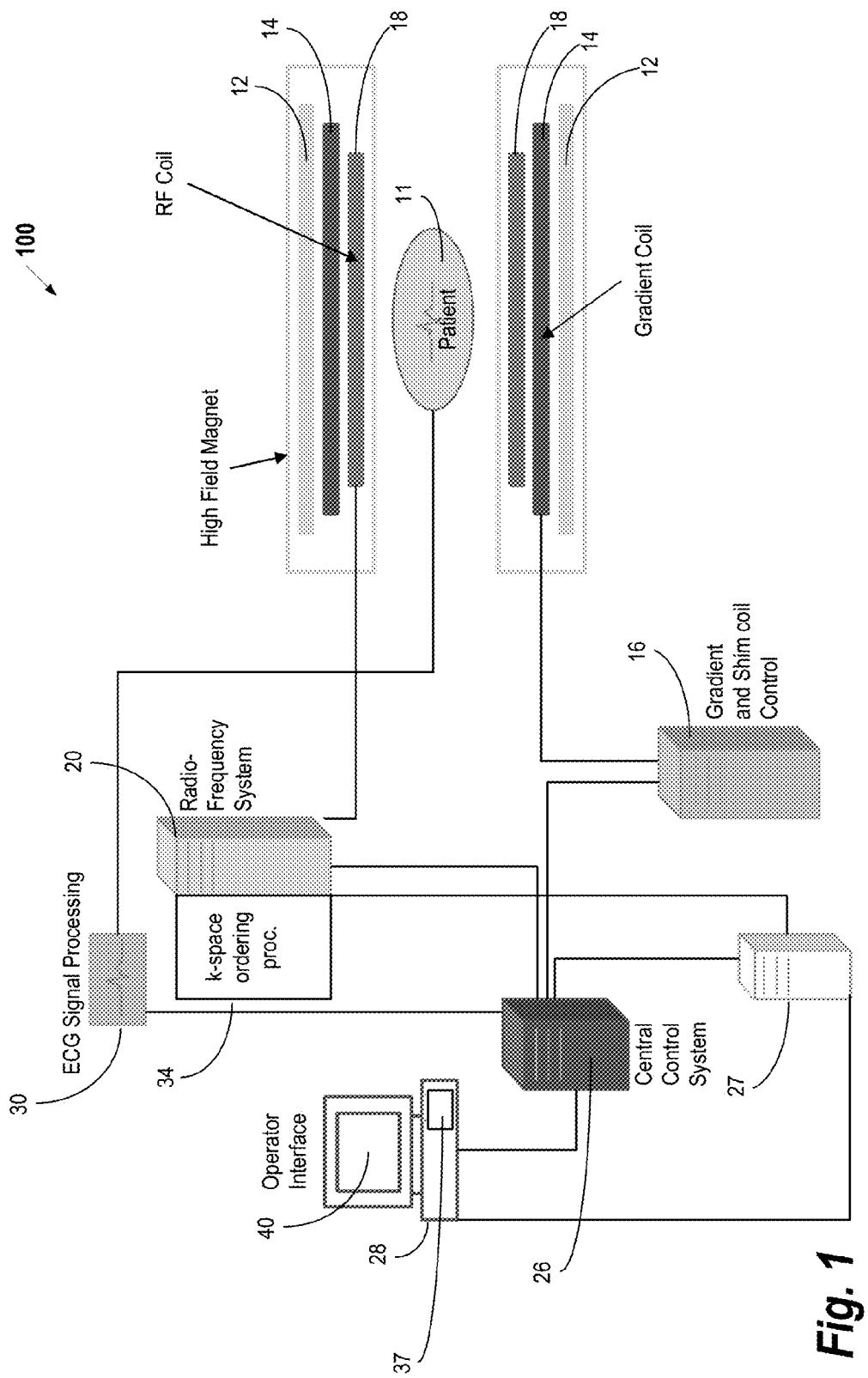
FIG. 1 shows system for ordering acquisition of frequency domain components representing MR image data for storage in a k-space storage array.

FIG. 1 shows system 100 for ordering acquisition of frequency domain components representing MR image data for storage in a k-space storage array. In system 100, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further, Radio Frequency (RF) module 20 provides RF pulse signals to RF coil 18, which in response produces magnetic field pulses which rotate the spins of the protons in the patient 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control unit 26, control slice-selection, phase-encoding, readout gradient magnetic fields, radio frequency transmission, and Magnetic Resonance signal detection, to acquire Magnetic Resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor. In some embodiments, the image data processor is located in central control unit 26, while in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in unit 34 stores corresponding individual frequency components comprising an MR dataset. The k-space array of individual data elements has a designated center and individual data elements which each have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and the magnetic field gradient change between successively acquired frequency components is substantially minimized.

Central control unit 26 uses information stored in an internal database to process the detected MR signals in a coordinated manner to generate high quality images of a selected slice (or slices) of the body and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central control unit 26 and enables user modification of Magnetic Resonance imaging signals in substantially real time. Display processor 37 processes the Magnetic Resonance signals to provide image representative data for display on display 40, for example.

In embodiments of the present invention, an alternative segmented multiple-slice EPI scheme is employed (henceforth referred to as "consecutive-segment imaging") that differs from the conventional "consecutive-slice imaging" scheme in the order in which the segments and slices are acquired. If, for example, there are three segments (A, B, and C) and five slices (1, 2, 3, 4, and 5), the conventional consecutive-slice approach acquires slices in the order:

1A 2A 3A 4A 5A 1B 2B 3B 4B 5B 1C 2C 3C 4C 5C, whereas the alternative consecutive-segment scheme described herein acquires the data in the order:

1A 1B 1C 2A 2B 2C 3A 3B 3C 4A 4B 4C 5A 5B 5C.

In the consecutive-segment scheme described herein, the time interval between acquisitions of adjacent segments within a slice is minimized. In turn, this minimizes the vulnerability of the segmented acquisition to factors such as patient motion and physiological changes that may occur between the acquisitions of adjacent segments within a slice. Note that the consecutive-segment technique described herein also reduces the time available for the magnetization within a slice to recover, which may reduce the overall signal level. Thus, in some embodiments, adjacent segments are acquired with varying flip angles so that each segment has equal magnetization. In some embodiments, the flip angles are set across the segments by calculating the progression that maximizes the transverse magnetization (e.g., for a three-segment slice and a recovery period much shorter than the tissue $T_1$ value, 35.1°-45°-90°). In other embodiments, the flip angles are set across the segments by using the same low flip angle for each segment (e.g., 20°). In these embodiments, one or more dummy or pre-saturation pulses may be applied to the anatomical area of interest before the acquisition to bring the magnetization into steady state.

While the consecutive-segment scheme dramatically reduces the vulnerability to motion, the temporal inefficiency may still be high, as it is with any segmented technique. In some embodiments, simultaneous multi-slice methods are utilized to acquire multiple EPI slices simultaneously, reducing the time required to collect multiple-slice data. These methods may utilize multi-band RF pulses to excite multiple slices simultaneously which results in all of the slices collapsing into a single image. Parallel image reconstruction methods, such as Slice-Generalized Autocalibrating Partially Parallel Acquisition (GRAPPA) are then used to separate the collapsed slices into individual images. The blipped-CAIPI encoding technique can be applied to Simultaneous Multi-Slice methods to control the aliasing pattern of the collapsed images in a way that results in a set of separated images with dramatically reduced artifact and noise levels. In turn, this enables far higher slice-acceleration factors than what can be achieved without the blipped-CAIPI encoding.

Simultaneous Multi-Slice methods increase the temporal sampling rate of the EPI acquisition but do not address the image blur and geometric distortion artifacts discussed above. While the blipped-CAIPI Simultaneous Multi-Slice method is compatible with conventional accelerated parallel imaging (so that the collapsed slices can also be accelerated in-plane), there is an interaction between the slice acceleration factor and the in-plane acceleration factor that limits the total possible acceleration for a given receive coil array. Also, the gradient blips used in the blipped-CAIPI technique take time to play out, which can lengthen the echo spacing in the EPI acquisition and lead to slight increases in image blur and geometric distortion artifacts.

Figure 2:
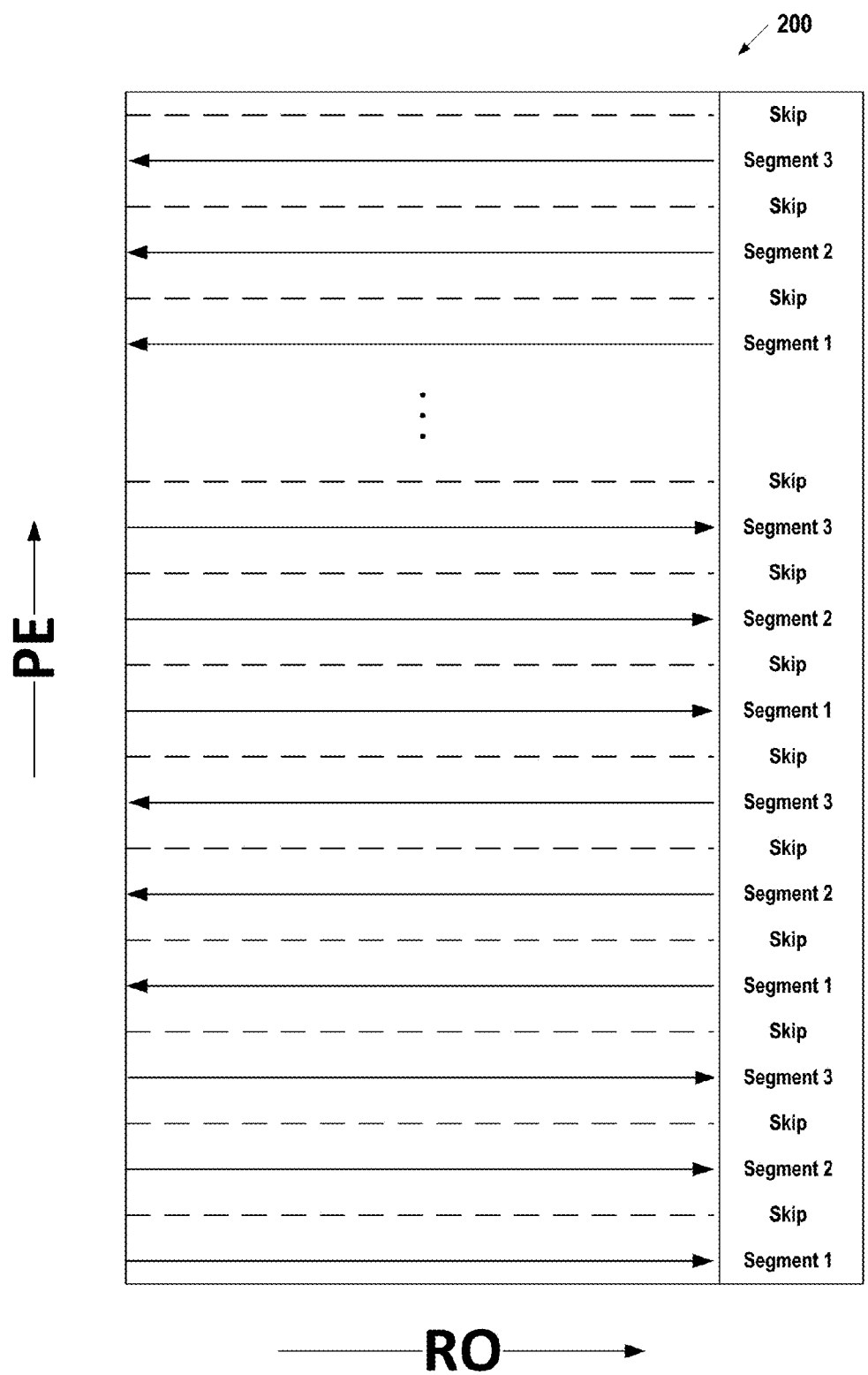
FIG. 2 provides an illustration of k-space acquisition technique which utilizes reduction factor 2 and 3 segments, as utilized in some embodiments of the present invention.
Figure 4:
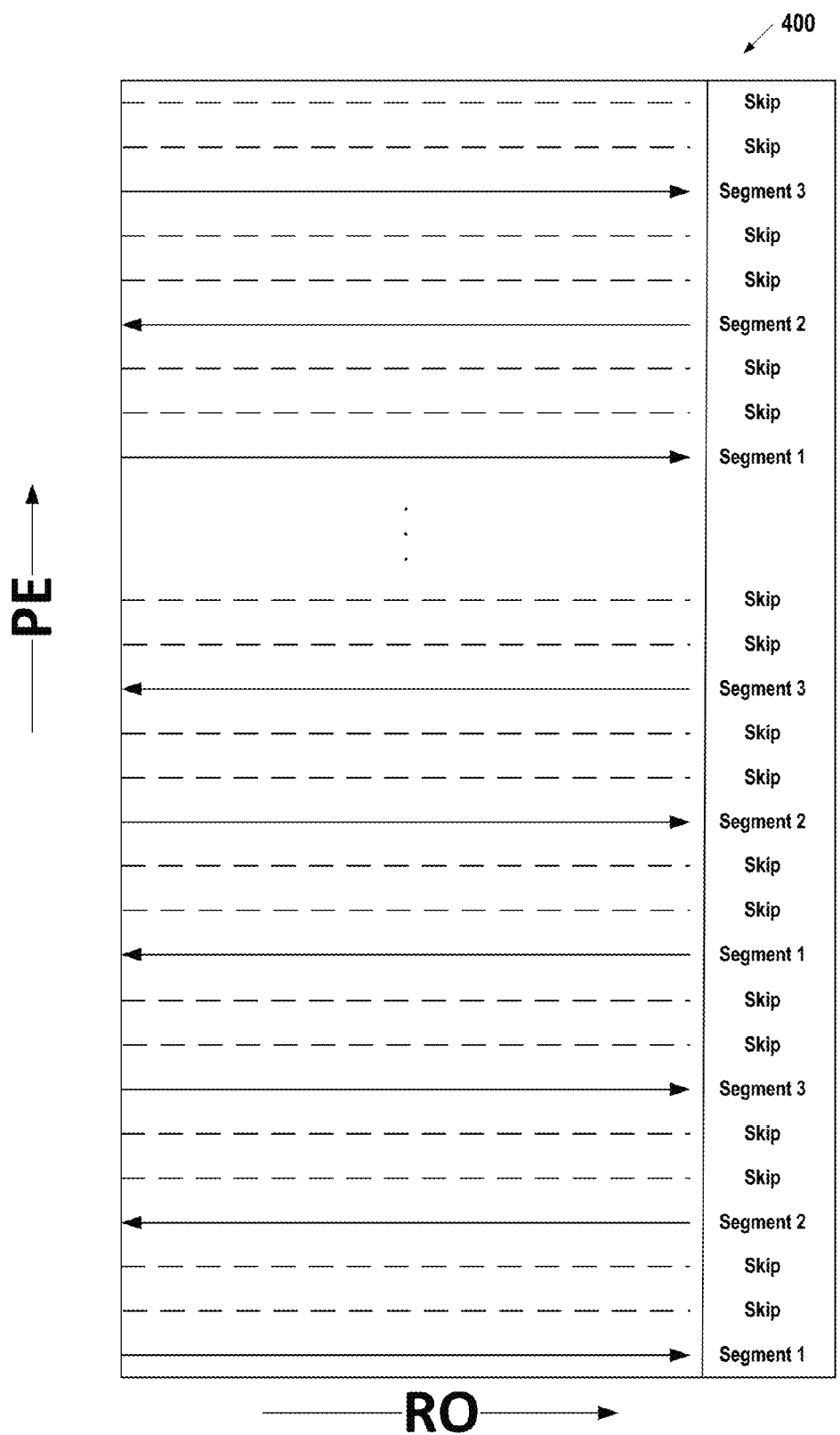
FIG. 4 provides an illustration of k-space acquisition technique which has reduction factor 3 and 3 segments with alternating segments acquired with opposite gradient polarity, as utilized in some embodiments of the present invention.

In various embodiments described herein, the issues discussed above are addressed by integrating a consecutive-segment multi-shot EPI acquisition is integrated with an in-plane accelerated acquisition. For an R-fold accelerated acquisition with S shots, this integration allows for a R•S-fold shorter EPI readout and a narrower echo spacing than the corresponding single-shot non-accelerated acquisition, and therefore can provide much higher total readout time reduction factor than what can be practically achieved by either the accelerated acquisition or the segmented acquisition alone. In some embodiments, the in-plane acceleration can be reduced via segmentation to increase SNR. For example, a 6-fold accelerated acquisition can be replaced by an acquisition with 3-fold acceleration and 2-fold segmentation, which provides the same total readout time reduction factor but higher SNR than the 6-fold accelerated case. Two examples of the integrated consecutive-segment multi-shot EPI with in-plane acceleration are shown in FIG. 2 and FIG. 4. Specifically, FIG. 2 provides an illustration of k-space acquisition technique 200 which utilizes reduction factor 2 (R=2), and 3 segments (S=3). FIG. 4 provides an illustration of k-space acquisition technique 400 which has reduction factor 3 (R=3), and 3 segments (S=3) with alternating segments acquired with opposite gradient polarity.

The cost of segmentation is always in the decreased temporal resolution (i.e., the time required to acquire a full image is increased by a factor equal to the number of segments). This cost is then offset by slice acceleration provided, for example, by the blipped-CAIPI Simultaneous Multi-Slice method. While the "consecutive-segment" acquisition reduces vulnerability to patient motion and dynamic physiological changes, the slice acceleration balances out the loss of temporal efficiency caused by the segmented multi-shot EPI acquisition. A given in-plane acceleration factor such as R=6 slice acceleration may not be feasible without introducing artifacts or noise enhancement due to the interaction between the slice acceleration factor and the in-plane acceleration factor that limits the total possible acceleration. In this case, by reducing the in-plane acceleration to R=3 through segmenting the acquisition into two shots (S=2), slice acceleration becomes practical. The segmentation therefore provides a means to distribute the acceleration into the slice direction in protocols with high in-plane acceleration factors.

There is an additional benefit to integrating the multi-shot acquisition with the blipped-CAIPI based Simultaneous Multi-Slice method. Because in a segmented acquisition each segment is excited by a distinct RF pulse, it is possible to impose different phases to each of the RF pulses across the segments to produce the same sampling pattern or field of view (FOV) shifting achieved by the gradient blips used in the blipped-CAIPI encoding technique. In some cases the gradient blips could be removed, which would result in a shorter EPI readout duration and narrower echo spacing.

This integrated consecutive-segmented, in-plane accelerated, and slice-accelerated method provides both high performance and extended flexibility in EPI acquisition protocol design. In the proposed invention, this image acquisition technique is combined with a related robust method for acquiring the necessary reference scan data. As has been shown previously, a "consecutive-segment" multi-shot EPI acquisition can provide reference data for calibrating the GRAPPA accelerated parallel imaging reconstruction method in a way that is echo-spacing matched to the accelerated image data, which results in robustness to motion, low artifact levels, and higher SNR in the final reconstructed image data.

Figure 3:
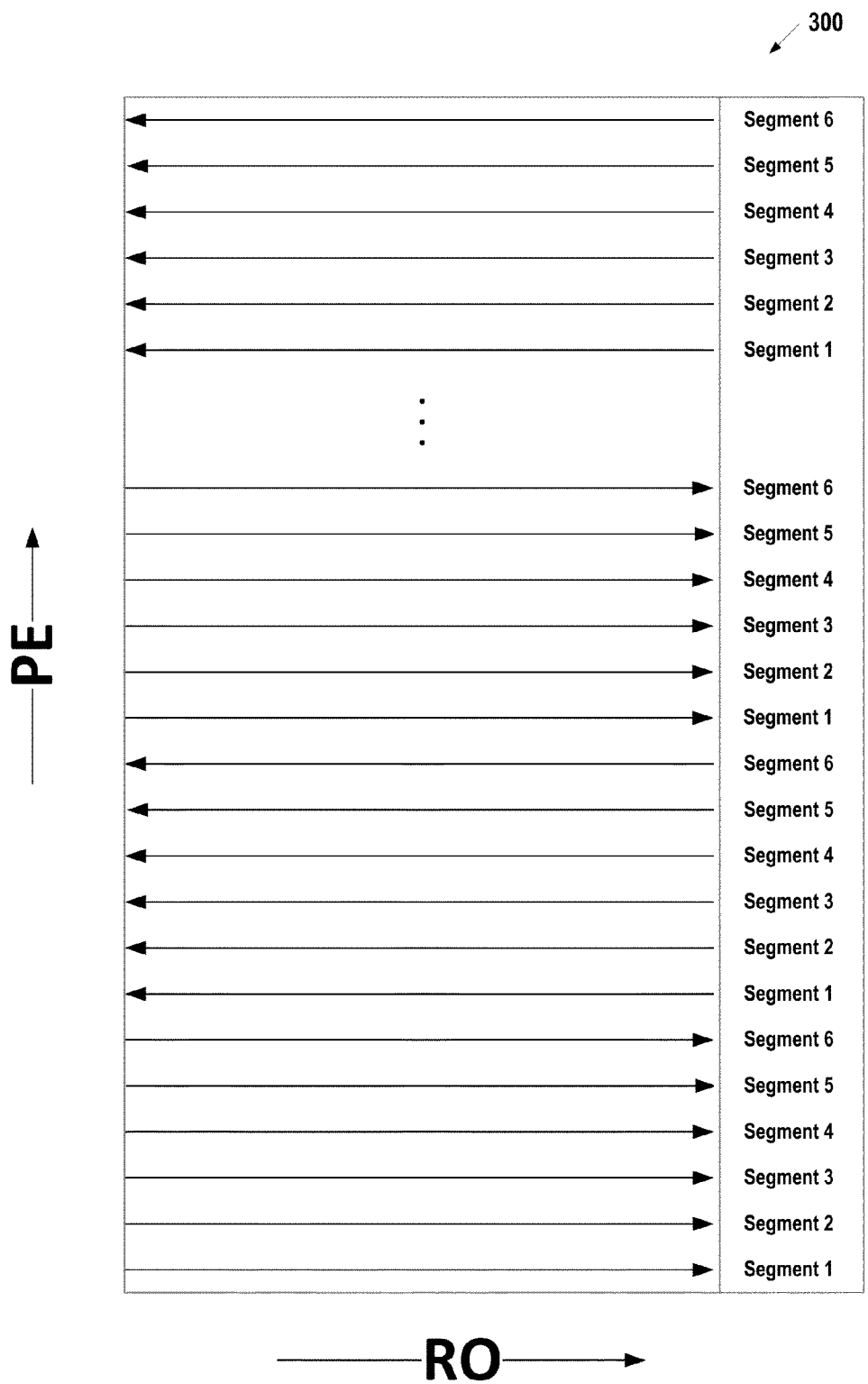
FIG. 3 provides an illustration of an auto-calibration signal (ACS) acquisition technique for the sampling scheme shown in FIG. 2, according to some embodiments of the present invention.
Figure 5:
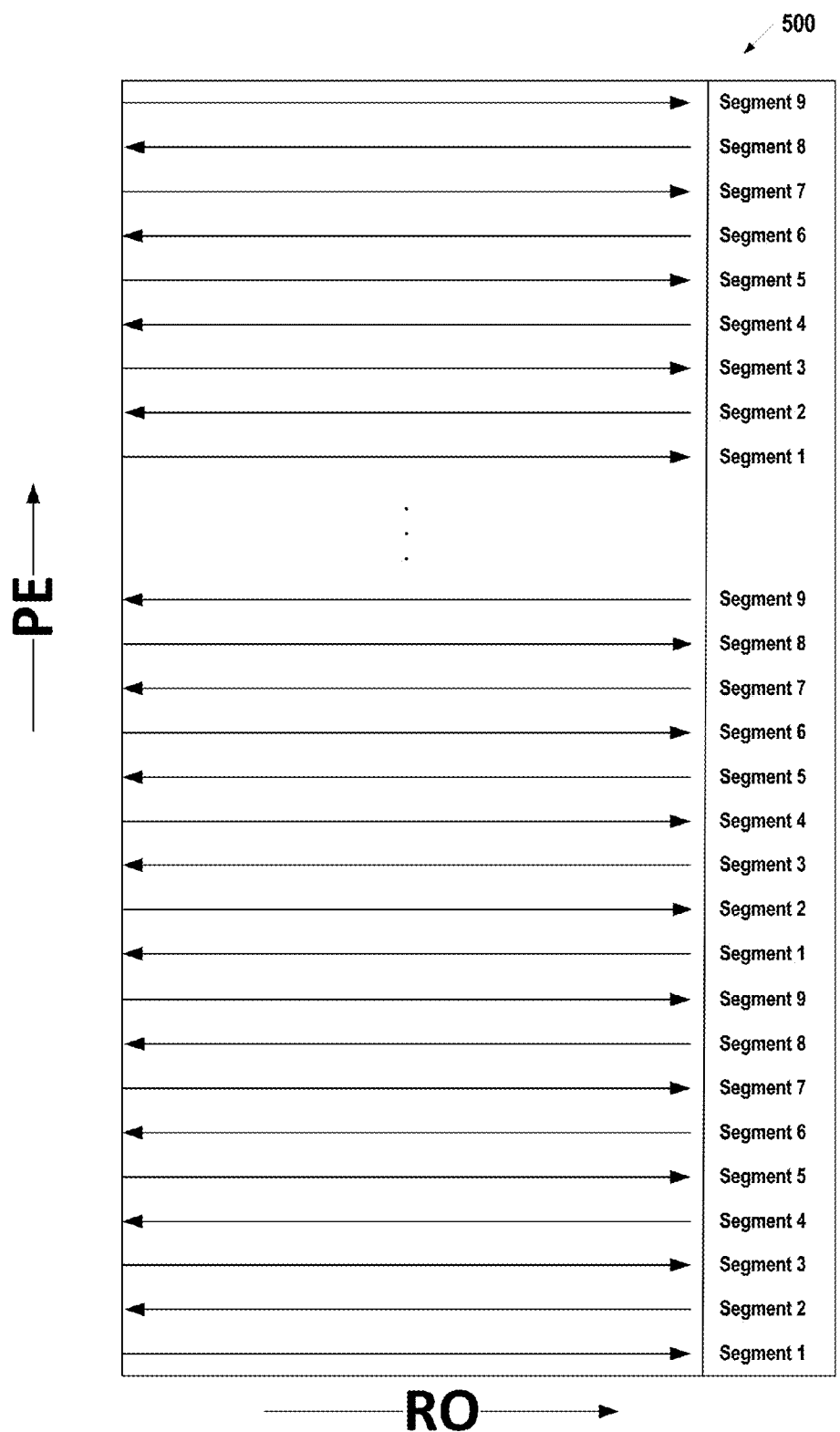
FIG. 5 provides an illustration of a ACS acquisition technique for the sampling scheme shown in FIG. 4, according to some embodiments of the present invention.

The robust reference scan methodology described above can be extended to the other techniques described herein by acquiring sufficient reference data for "consecutive-segmented", in-plane accelerated data: e.g., for an R=2, S=3 image acquisition the corresponding "consecutive-segment" calibration data would require 6 shots to adequately sample k-space for the GRAPPA kernel training. FIG. 3 provides an example of auto-calibration signal (ACS) acquisition scheme 300 used for GRAPPA kernel training for the accelerated image data acquired using sampling scheme shown in FIG. 2. The ACS data is acquired in RS segments, which in this example is 2.3=6. The corresponding reference data acquisition scheme 500 for the R=3, S=3 accelerated image data case is shown in FIG. 5. Note that, in cases where the product of R and S is odd-valued, it is possible to reverse the polarity of alternate segments so that all odd lines of the reference data k-space are acquired in one direction and all even lines of k-space may be acquired in the opposite direction (as shown in FIG. 5). This results in a Nyquist-like "N/2" ghosting pattern if there is any mismatch between readout lines with opposing polarities which results in a more favorable pattern of aliasing. Because the same reference data for the in-plane GRAPPA training can be used as reference data for the Slice-GRAPPA training, the extended "consecutive-segmented" multi-shot EPI acquisition provide the necessary training data and can be combined with the integrated "consecutive-segmented", in-plane accelerated, and slice-accelerated image data acquisition method.

In applications where the ACS data has low SNR such as high resolution imaging, it is possible to add additional repetitions of the ACS acquisition which can be averaged together in order to increase ACS SNR. This is a natural extension of the consecutive segment method in that additional segments within a given slice can be repeated as the magnetization is already in steady state. When dummy pulses are used, the additional ACS repetitions do not lead to a significant increase in ACS acquisition time. In one embodiment, a single additional segment is acquired with a high flip angle pulse (e.g. 90°) in order to maximize signal for the last segment. This last segment provides enough training data for the slice GRAPPA fitting.

In some embodiments, the slices which are collapsed on top of each other in the simultaneous multi-slice method are acquired sequentially in the proposed reference scan method. This reduces susceptibility of slice-GRAPPA reconstruction to patient motion during the reference scan acquisition.

Figure 6:
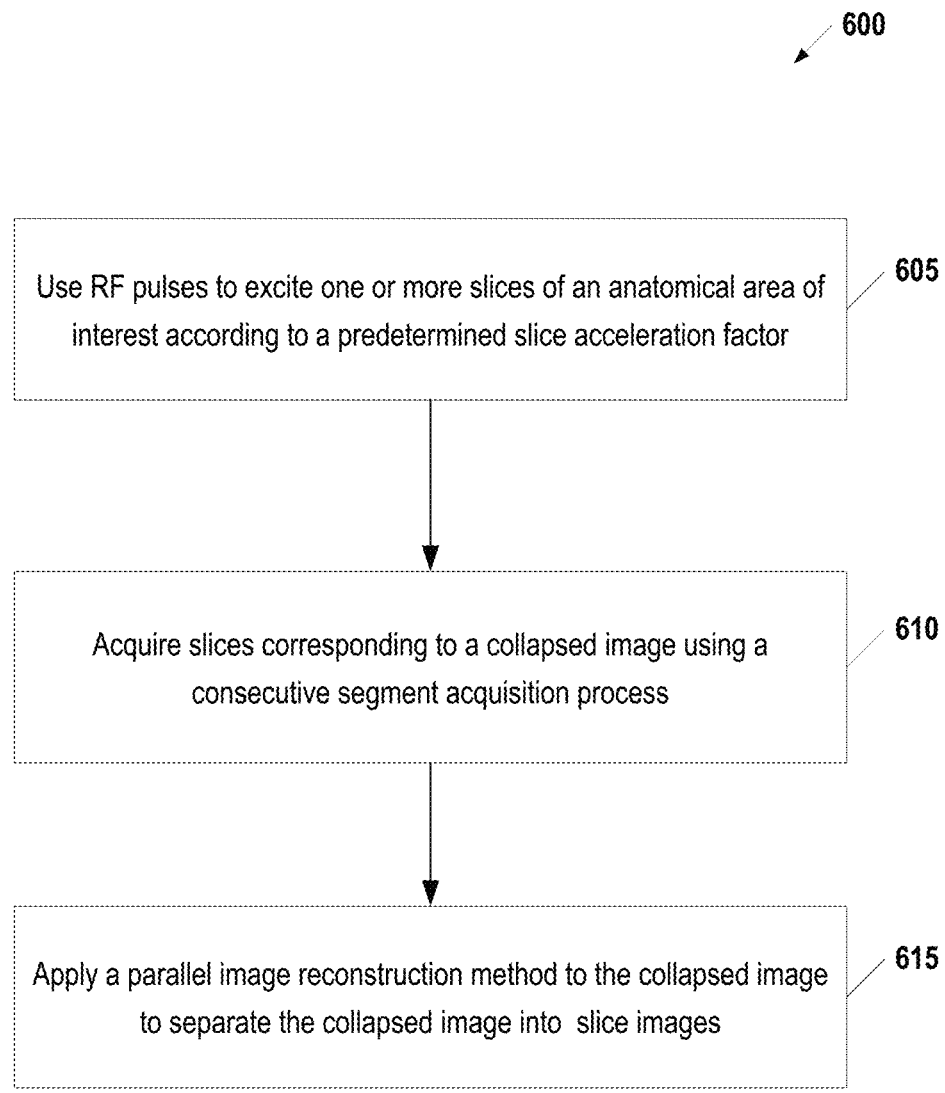
FIG. 6 provides a method for accelerated segmented MR image data acquisition, according to some embodiments of the present invention.

FIG. 6 provides a method 600 for accelerated segmented magnetic resonance (MR) image data acquisition, according to some embodiments of the present invention. This method may be performed, for example, using system 100 illustrated in FIG. 1. At 605 a Radio Frequency (RF) Generator uses RF pulses to excite one or more slices of an anatomical area of interest according to a predetermined slice acceleration factor. Various slice acceleration factors may be used within the scope of the present invention. For example, in some embodiments, the slice acceleration factor is 1 and each slice is excited separately. In other embodiments, the slice acceleration factor is greater than 1 and each of the plurality of RF pulses is a multiband RF pulse which simultaneously excites multiple slices of an anatomical area of interest.

Continuing with reference to FIG. 6, at 610 the RF Generator uses a consecutive-segment acquisition process to acquire a collapsed image of a group of slices in response to the RF pulses being applied to the anatomical region of interest at 605. In some embodiments, the consecutive segment acquisition process applies a varying flip angle sequence across consecutive segments of k-space line data representative of a respective slice. This varying flip angle sequence may be, for example, a progression of flip angles that maximizes magnetization of a region of the anatomical area of interest corresponding to the respective slice. In some embodiments, the varying flip angle sequence includes a predetermined low flip angle (e.g., 20 degrees) repeated for each segment included in the respective slice. One or more dummy pulses may be applied prior to acquiring each of the plurality of slices.

Returning to FIG. 6, at 615, an image data processor applies a parallel image reconstruction method such as Slice GRAPPA may be applied to the collapsed image to separate the collapsed image into different slice images. In some embodiments, an encoding technique such as Blipped-Controlled Aliasing in Parallel Imaging is used to control aliasing patterns of the collapsed image.

It should be noted that the consecutive segment acquisition process described above may also be extended to a reference scan performed prior to the start of the method 600 illustrated in FIG. 6. Thus, in some embodiments, a reference scan of the anatomical area of interest is performed to acquire reference slices using the consecutive segment acquisition process. Then, the reference slices are used to calibrate the parallel image reconstruction method applied at 615 such that echo-spacing of the reference slices is matched to accelerated image data corresponding to the collapsed image.

The techniques described herein have various benefits over conventional systems. For example, image quality can be improved in both structural and functional imaging. This includes structural imaging (anatomical sequences) such as fluid-attenuated inversion recovery (FLAIR), $T_2$-weighted spin echo and turbo spin echo, and inversion prepared $T_1$-weighted imaging, applied to both brain and body applications such as liver and pelvis. This may also include functional imaging such as fMRI (using as contrast BOLD, CBV, CBF, etc.), perfusion (e.g., DSC, DCE, ASL, etc.), diffusion (e.g., DTI, DKI, DSI, q-ball, etc.), and velocity imaging, as well as quantitative imaging such as for $T_1$, $T_2$, and $T_2^*$ mapping.

Figure 7:
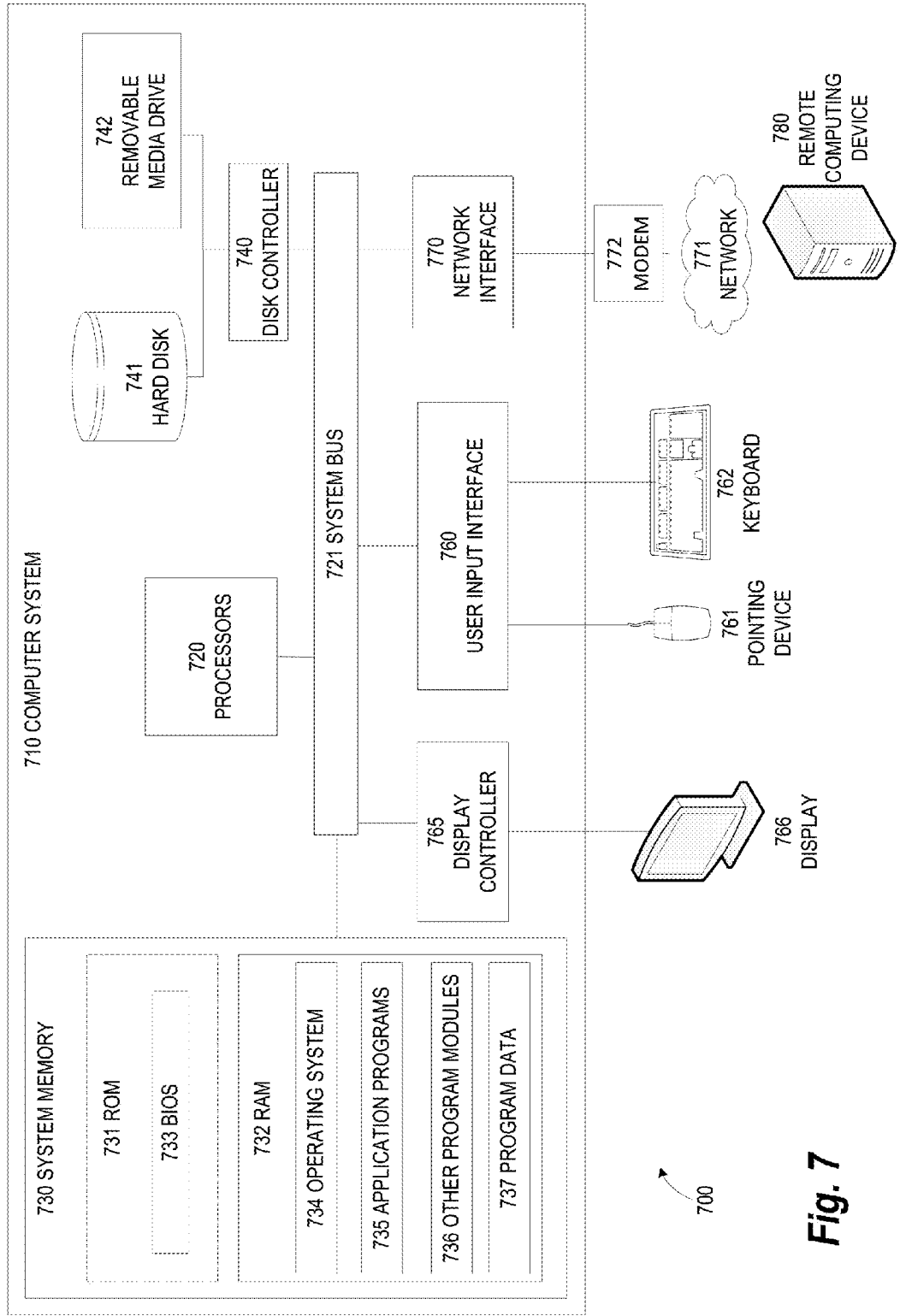
FIG. 7 illustrates an exemplary computing environment within which embodiments of the invention may be implemented.

FIG. 7 illustrates an exemplary computing environment 700 within which embodiments of the invention may be implemented. For example, computing environment 700 may be used to implement one or more components of system 100 shown in FIG. 1. Computers and computing environments, such as computer system 710 and computing environment 700, are known to those of skill in the art and thus are described briefly here.

As shown in FIG. 7, the computer system 710 may include a communication mechanism such as a system bus 721 or other communication mechanism for communicating information within the computer system 710. The computer system 710 further includes one or more processors 720 coupled with the system bus 721 for processing the information.

The processors 720 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 7, the computer system 710 also includes a system memory 730 coupled to the system bus 721 for storing information and instructions to be executed by processors 720. The system memory 730 may include computer readable storage media in the form of volatile and/or nonvolatile memory, such as read only memory (ROM) 731 and/or random access memory (RAM) 732. The system memory RAM 732 may include other dynamic storage device(s) (e.g., dynamic RAM, static RAM, and synchronous DRAM). The system memory ROM 731 may include other static storage device(s) (e.g., programmable ROM, erasable PROM, and electrically erasable PROM). In addition, the system memory 730 may be used for storing temporary variables or other intermediate information during the execution of instructions by the processors 720. A basic input/output system 733 (BIOS) containing the basic routines that help to transfer information between elements within computer system 710, such as during start-up, may be stored in system memory ROM 731. System memory RAM 732 may contain data and/or program modules that are immediately accessible to and/or presently being operated on by the processors 720. System memory 730 may additionally include, for example, operating system 734, application programs 735, other program modules 736 and program data 737.

The computer system 710 also includes a disk controller 740 coupled to the system bus 721 to control one or more storage devices for storing information and instructions, such as a magnetic hard disk 741 and a removable media drive 742 (e.g., floppy disk drive, compact disc drive, tape drive, and/or solid state drive). The storage devices may be added to the computer system 710 using an appropriate device interface (e.g., a small computer system interface (SCSI), integrated device electronics (IDE), Universal Serial Bus (USB), or FireWire).

The computer system 710 may also include a display controller 765 coupled to the system bus 721 to control a display 766, such as a cathode ray tube (CRT) or liquid crystal display (LCD), for displaying information to a computer user. The computer system includes an input interface 760 and one or more input devices, such as a keyboard 762 and a pointing device 761, for interacting with a computer user and providing information to the one or more processors 720. The pointing device 761, for example, may be a mouse, a light pen, a trackball, or a pointing stick for communicating direction information and command selections to the one or more processors 720 and for controlling cursor movement on the display 766. The display 766 may provide a touch screen interface which allows input to supplement or replace the communication of direction information and command selections by the pointing device 761.

The computer system 710 may perform a portion or all of the processing steps of embodiments of the invention in response to the one or more processors 720 executing one or more sequences of one or more instructions contained in a memory, such as the system memory 730. Such instructions may be read into the system memory 730 from another computer readable medium, such as a magnetic hard disk 741 or a removable media drive 742. The hard disk 741 may contain one or more datastores and data files used by embodiments of the present invention. Datastore contents and data files may be encrypted to improve security. The processors 720 may also be employed in a multi-processing arrangement to execute the one or more sequences of instructions contained in system memory 730. In alternative embodiments, hard-wired circuitry may be used in place of or in combination with software instructions. Thus, embodiments are not limited to any specific combination of hardware circuitry and software.

As stated above, the computer system 710 may include at least one computer readable medium or memory for holding instructions programmed according to embodiments of the invention and for containing data structures, tables, records, or other data described herein. The term "computer readable medium" as used herein refers to any medium that participates in providing instructions to the one or more processors 720 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as hard disk 741 or removable media drive 742. Non-limiting examples of volatile media include dynamic memory, such as system memory 730. Non-limiting examples of transmission media include coaxial cables, copper wire, and fiber optics, including the wires that make up the system bus 721. Transmission media may also take the form of acoustic or light waves, such as those generated during radio wave and infrared data communications.

The computing environment 700 may further include the computer system 710 operating in a networked environment using logical connections to one or more remote computers, such as remote computer 780. Remote computer 780 may be a personal computer (laptop or desktop), a mobile device, a server, a router, a network PC, a peer device or other common network node, and typically includes many or all of the elements described above relative to computer system 710. When used in a networking environment, computer system 710 may include modem 772 for establishing communications over a network 771, such as the Internet. Modem 772 may be connected to system bus 721 via user network interface 770, or via another appropriate mechanism.

Network 771 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 710 and other computers (e.g., remote computing 780). The network 771 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 771.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user directed initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A method for accelerated segmented magnetic resonance (MR) image data acquisition, the method comprising:
   using a plurality of Radio Frequency (RF) pulses to excite one or more slices of an anatomical area of interest according to a predetermined slice acceleration factor;
   acquiring a collapsed image of the one or more slices in response to the plurality of RF pulses, wherein each of the one or more slices is individually acquired using a consecutive segment acquisition process; and
   applying a parallel image reconstruction method to the collapsed image to separate the collapsed image into a plurality of slice images.

2. The method of claim 1, wherein the predetermined slice acceleration factor is greater than 1 and each of the plurality of RF pulses is a multiband RF pulse operable to simultaneously excite the one or more slices of the anatomical area of interest.

3. The method of claim 1, wherein the consecutive segment acquisition process applies a varying flip angle sequence across a plurality of consecutive segments of k-space line data representative of a respective slice.

4. The method of claim 3, wherein the varying flip angle sequence is a progression of flip angles that maximizes magnetization of a region of the anatomical area of interest corresponding to the respective slice.

5. The method of claim 3, wherein the varying flip angle sequence comprises a predetermined low flip angle repeated for each segment included in the respective slice.

6. The method of claim 5, further comprising:
applying one or more dummy pulses prior to acquiring each of the one or more slices.

7. The method of claim 1, wherein the consecutive segment acquisition process is integrated with an in-plane accelerated acquisition process applied to the anatomical area of interest.

8. The method of claim 1, wherein the parallel image reconstruction method is Slice GRAPPA.

9. The method of claim 8, further comprising:
performing a reference scan of the anatomical area of interest to acquire a plurality of reference slices using the consecutive segment acquisition process; and
using the plurality of reference slices to calibrate the parallel image reconstruction method such that echo-spacing of the plurality of reference slices is matched to accelerated image data corresponding to the collapsed image.

10. The method of claim 9, further comprising:
performing a plurality of additional reference scans of the anatomical area of interest to acquire a plurality of additional reference slices using the consecutive segment acquisition process; and
averaging the plurality of reference slices and the plurality of additional reference scans together to yield a plurality of averaged reference slices,
wherein the parallel image reconstruction method is calibrated using the plurality of averaged reference slices.

11. The method of claim 9, further comprising:
following the reference scan, performing an additional reference scan to acquire one segment of the anatomical area of interest using a high flip angle pulse; and
using the one segment of the anatomical area of interest to calibrate a Slice GRAPPA in-plane kernel used in the parallel image reconstruction method.

12. The method of claim 1, further comprising:
applying an encoding technique to control an aliasing pattern of the collapsed image.

13. A method for accelerated segmented magnetic resonance (MR) image data acquisition, the method comprising:
applying a plurality of RF pulses to excite a plurality of slices of an anatomical area of interest according to a predetermined slice acceleration factor;
performing a slice acquisition process for each respective slice included in the plurality of slices to acquire a collapsed image, the slice acquisition process comprising:
creating a varying flip angle sequence to be applied across a plurality of consecutive segments of k-space line data representative of the respective slice, and
acquiring each segment of k-space line data included in the respective slice using the varying flip angle sequence; and
applying a parallel image reconstruction method to the collapsed image to separate the collapsed image into a plurality of slice images.

14. The method of claim 13, wherein the predetermined slice acceleration factor is greater than 1 and each of the plurality of RF pulses is a multiband RF pulse operable to simultaneously excite the plurality of slices of the anatomical area of interest.

15. The method of claim 13, further comprising:
wherein the varying flip angle sequence is a progression of flip angles that maximizes magnetization of a region of the anatomical area of interest located at the respective slice.

16. The method of claim 13, wherein the varying flip angle sequence comprises a predetermined low flip angle repeated for each segment of k-space line data included in the respective slice.

17. The method of claim 16, further comprising:
applying one or more dummy pulses prior to the slice acquisition process for each respective slice.

18. The method of claim 13, wherein the parallel image reconstruction method is Slice GRAPPA.

19. The method of claim 18, further comprising:
performing a reference scan of the anatomical area of interest to acquire a plurality of reference slices using the slice acquisition process;
using the plurality of reference slices to calibrate the parallel image reconstruction method such that echo-spacing of the plurality of reference slices is matched to accelerated image data corresponding to the collapsed image.

20. The method of claim 13, further comprising:
applying an encoding technique to control an aliasing pattern of the collapsed image.

21. The method of claim 20, wherein the encoding technique comprises a Blipped-Controlled Aliasing in Parallel Imaging technique.

22. A system for performing accelerated segmented magnetic resonance (MR) image data acquisition, the system comprising:
a Radio Frequency (RF) generator configured to use a plurality of RF coils to:
simultaneously excite a plurality of slices of an anatomical area of interest with a plurality of multi-band RF pulses, and
acquire a collapsed image comprising a plurality of acquired slices in response to the plurality of multi-band RF pulses, wherein each of the plurality of acquired slices is individually acquired using a consecutive segment acquisition process; and
an image data processor configured to apply a parallel image reconstruction method to the collapsed image to separate the collapsed image into a plurality of slice images.

* * * * *